(12) United States Patent
Sato (10) Patent No.: US 6,807,065 B2
(45) Date of Patent: Oct. 19, 2004

(54) MULTILAYER PRINTED CIRCUIT BOARD

(75) Inventor: Masahiro Sato, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 10/615,378

(22) Filed: Jul. 9, 2003

(65) Prior Publication Data

US 2004/0053014 A1 Mar. 18, 2004

(30) Foreign Application Priority Data

Jul. 9, 2002 (JP) .................................. P2002-200347

(51) Int. Cl.[7] .......................... H05K 7/02; H05K 7/06; H05K 7/08; H05K 7/10
(52) U.S. Cl. ..................... 361/780; 361/794; 333/12; 174/261
(58) Field of Search ................... 361/780, 792–795; 174/260–266; 257/662–663, 691, 728; 333/12

(56) References Cited

U.S. PATENT DOCUMENTS

| | | | | |
|---|---|---|---|---|
| 4,739,448 A | * | 4/1988 | Rowe et al. ................ 361/719 |
| 4,845,311 A | * | 7/1989 | Schreiber et al. ............ 174/36 |
| 5,691,568 A | * | 11/1997 | Chou et al. ................. 257/691 |
| 5,719,750 A | * | 2/1998 | Iwane ........................ 361/794 |
| 6,172,305 B1 | * | 1/2001 | Tanahashi ................... 174/255 |
| 6,208,220 B1 | * | 3/2001 | Logothetis .................. 333/116 |
| 6,479,758 B1 | * | 11/2002 | Arima et al. ............... 174/260 |
| 6,501,181 B2 | * | 12/2002 | Albinsson ................... 257/774 |
| 6,657,130 B2 | * | 12/2003 | Van Dyke et al. .......... 174/255 |
| 6,712,284 B2 | * | 3/2004 | Aoki et al. ................. 257/183 |

FOREIGN PATENT DOCUMENTS

| JP | 11-150371 | 6/1999 |
|---|---|---|
| JP | 2000-188478 | 7/2000 |

* cited by examiner

Primary Examiner—Kamand Cuneo
Assistant Examiner—Tuan Dinh
(74) Attorney, Agent, or Firm—McDermott, Will & Emery LLP

(57) ABSTRACT

A multilayer PCB has first and second signal transmission lines and first and second ground layers. A signal via is connected between the first and second transmission lines. Ground vias extending parallel to the signal via are connected between the first and second ground layers. The end of the first ground layer protrudes with respect to the second ground layer and extends nearer to the signal via than the second ground layer. Thus, it is possible to stabilize the characteristic impedance of the first transmission line.

7 Claims, 8 Drawing Sheets

MULTILAYER PRINTED CIRCUIT BOARD

BACKGROUND OF THE INVENTION

1. Field of the Invention

The present invention relates to a multilayer printed circuit board (PCB).

2. Related Background Art

Japanese Laid-Open Patent Publication No. 2000-188478 discloses a multilayer PCB in which the dimensions of conductors (signal vias) and a middle connecting layer (a via land) between the conductors are determined to stabilize the characteristic impedance of the PCB.

SUMMARY OF THE INVENTION

In one aspect, the invention relates to a multilayer PCB comprising: a first signal transmission line; a second signal transmission line opposite to the first transmission line; a first ground layer opposite to the first transmission line; a second ground layer opposite to the first ground layer; a first insulator disposed between the first and second transmission lines; a second insulator disposed between the first and second ground layers; a signal via passing through the first insulator and connected between the first and second transmission lines; and a ground via passing through the second insulator and connected between the first and second ground layers. The signal via is separated from the first and second ground layers. The ground via is separated from the signal via. The first ground layer has an end protruding with respect to the second ground layer. The end extends nearer to the signal via than an end of the second ground layer opposite to the end.

The end of the first ground layer may include a portion which abuts an end face of the ground via and a portion directly adjacent to the abutting portion. The end of the second ground layer may abut an opposite end face of the ground via. The adjacent portion of the first ground layer may extend from the ground via toward the signal via along the first transmission line beyond the end of the second ground layer.

An area of the first ground layer overlaid with the first transmission line enlarges due to the protruding end of the first ground layer. Therefore, the characteristic impedance of the transmission line is continuous by a longer length, and this improves impedance matching of the transmission line. Thus, the characteristic impedance of the PCB can be stabilized.

The end of the second ground is farer from the signal via than the end of the first ground layer Therefore, the ground via can be sufficiently separated from the signal via, and this can advantageously stabilize the characteristic impedance.

The PCB may further comprise another plurality of ground vias. The ground via and the other plurality of ground vias may be disposed at equal intervals on a line forming a square around the signal via. Such arrangement of the grand vias is beneficial when the first transmission line has two sides extending straight in parallel. In this case, some of the ground vias can be placed in parallel to these sides of the transmission line with a uniform distance. Therefore, it is possible to reduce the adverse effect of the ground vias on the impedance matching of the first transmission line. This can further stabilize the characteristic impedance.

The ground via and the other plurality of ground vias may be disposed at equal intervals on a line forming a circle around the signal via. The impedance matching can be favorably achieved by arranging the ground vias at equal intervals around the signal via. Such arrangement can simplify designing the PCB.

In another aspect, the present invention relates to a light transceiver comprising: the above PCB; and light-emitting module, a light-receiving module and an electronic element mounted on the PCB. The electronic element is electrically connected to the light-emitting module or the light-receiving module by the first and second transmission lines of the PCB.

In still another aspect, the present invention relates to a transponder comprising: the above PCB; a light-emitting module, a light-receiving module, a multiplexing IC and a demultiplexing IC fixed to the PCB. The light-emitting module may be electrically connected to the multiplexing IC by the first and second transmission lines of the PCB. The light-receiving module may be electrically connected to the demultiplexing IC by the first and second transmission lines of the PCB.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in greater detail with reference to the accompanying drawings. To facilitate understanding, identical reference numerals have been used, where possible, to designate identical or equivalent elements that are common to the figures without repeating the overlapping descriptions.

First Embodiment

Figure 1:
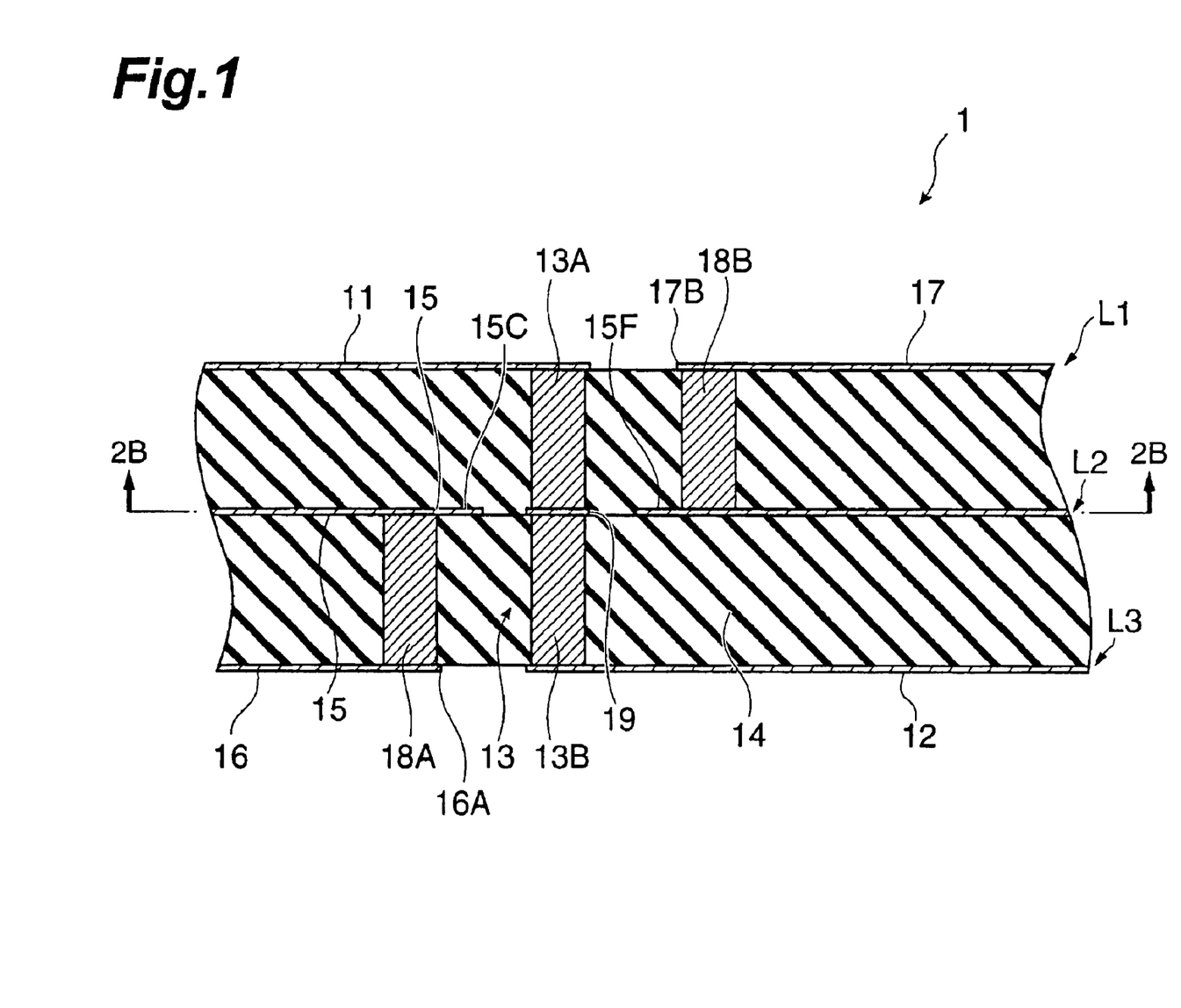
FIG. 1 is a sectional side elevation of a multilayer PCB in accordance with an embodiment of the present invention.
Figure 2A:
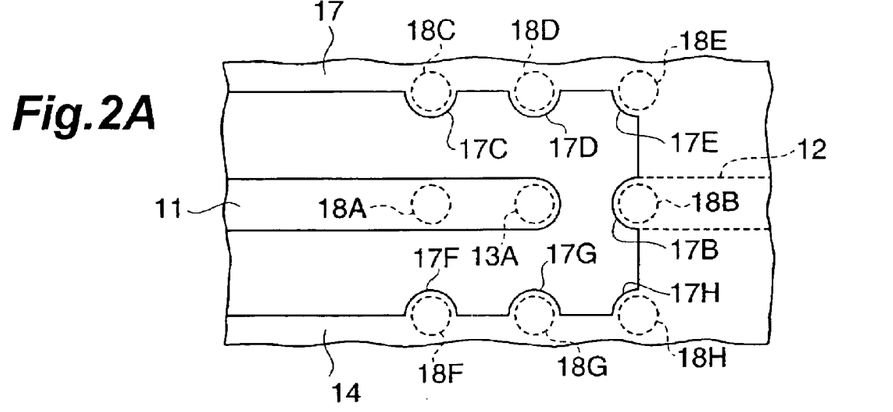
FIG. 2A is a top plan view of the PCB shown in FIG. 1.
Figure 2B:
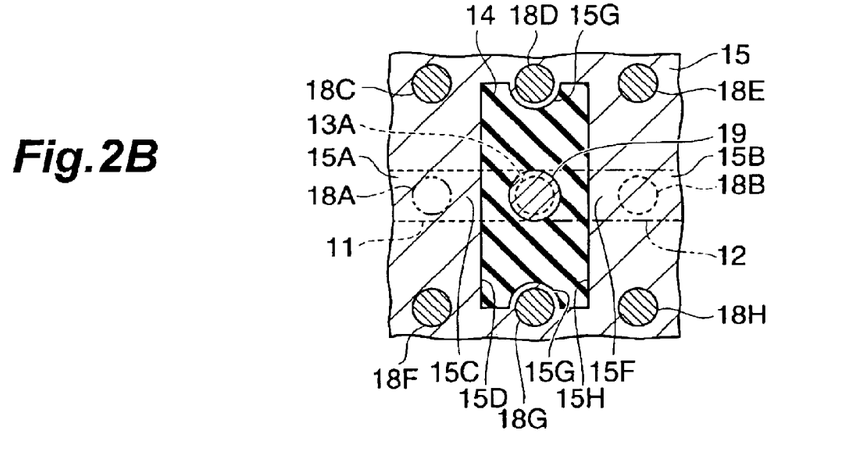
FIG. 2B is a sectional view taken along the line 2B—2B in FIG. 1.
Figure 2C:
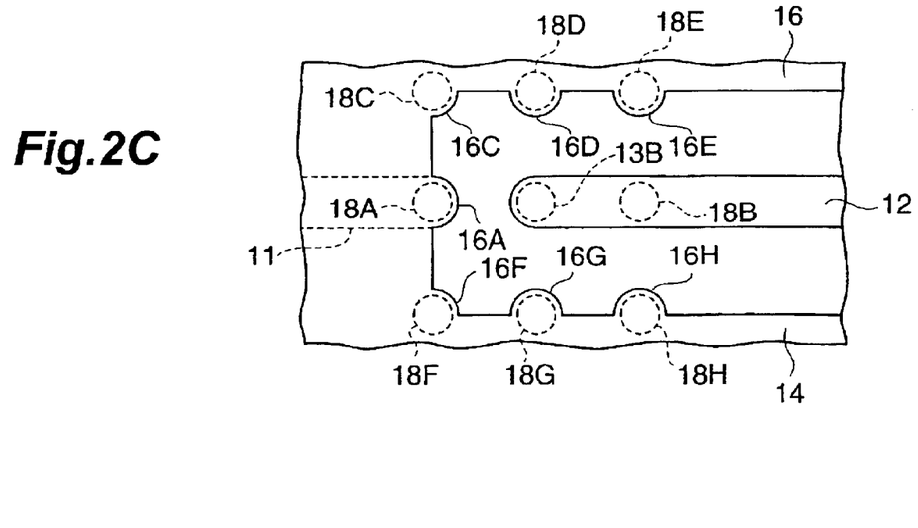
FIG. 2C is a bottom plan view of the PCB shown in FIG. 1.

Referring to FIGS. 1 and 2A–2C, a first embodiment of the present invention will now be described. FIG. 1 is a sectional side elevation of a multilayer PCB of the first embodiment, FIG. 2A is a top plan view of the PCB, FIG. 2B is a sectional view taken along the line 2B—2B in FIG. 1, and FIG. 2C is a bottom plan view of the PCB.

As shown in FIG. 1, the multilayer PCB 1 has first to third layers L1–L3. The first layer L1 includes a first signal transmission line 11. The third layer L3 includes a second signal transmission line 12. As shown in FIG. 2A and FIG. 2C, the first and second transmission lines 11 and 12 may be elongated layers made of copper, for example, and have a thickness of approximately 0.018 mm.

An end of the first transmission line 11 is opposite to an end of the second transmission line 12. These ends are connected to each other through a signal via 13. The signal via 13 is a cylindrically shaped conductor extending along the layered direction of the layers L1 to L3. A signal current on the first transmission line 11 can flow through the signal via 13 into the second transmission line 12. The signal via 13 includes a first via 13A and a second via 13B placed coaxially and aligned with each other in series. The vias 13A and 13B are both cylindrical and have the same diameter. A via land 19 is placed between the end faces of the vias 13A and 13B. The via land 19 will be described in detail later.

An electric insulator 14 is sandwiched between the first and second layers L1 and L2, and also between the second and third layers L2 and L3. Therefore the insulator 14 is interposed between the first and second transmission lines 11 and 12. The thickness of the insulator 14 is approximately 0.11 mm. The first transmission line 11 is provided on the front surface of the insulator 14, and the second transmission line 12 is provided on the back surface thereof. The signal via 13 passes through the insulator 14.

A second layer L2 is located between the first and third layers L1 and L3 in the insulator 14. The second layer L2 includes a first ground layer 15 located opposite to the first and second transmission lines 11 and 12. As shown in FIG. 2B, the ground layer 15 extends surrounding the signal via 13 in the second layer L2. The ground layer 15 includes a portion 15A overlaid with the first transmission line 11 and a portion 15B overlaid with the second transmission line 12.

The third layer L3 includes a second ground layer 16 opposite to the first ground layer 15. The insulator 14 is interposed between the first and second ground layers 15 and 16. As shown in FIG. 2C, the second ground layer 16 surrounds the second transmission line 12 in the third layer L3. A first ground via 18A is connected between the first and second ground layers 15 and 16 through the insulator 14. The ground layers 15 and 16 are kept at nearly the same potential by the via 18A.

The first layer L1 includes a third ground layer 17 opposite to the first ground layer 15. The insulator 14 is interposed between the first and third ground layers 15 and 17. As shown in FIG. 2A, the third ground layer 17 surrounds the first transmission line 11 in the first layer L1. A second ground via 18B is connected between the first and third ground layers 15 and 17 through the insulator 14. The ground layers 15 and 17 are kept at nearly the same potential by the via 18B.

Third to eighth ground vias 18C to 18H are provided to the periphery of the signal via 13 as well as the vias 18A and 18B. The first to eighth ground vias 18A to 18H are cylinders with the same diameter that is filled with an electric conductor. The ground vias 18A to 18H are provided for impedance matching of the signal via 13. The ground vias 18A to 18H are placed at equal intervals on a line that forms a square around the signal via 13 in a plane perpendicular to the via 13. The vias 18C–18H are arranged along the transmission lines 11 and 12 at the side thereof. As shown in FIGS. 2A–2C, the square shaped arrangement enables a constant distance between the vias 18C–18H and the transmission lines 11 and 12. This simplifies impedance design of the PCB 1, and the distance between the ground vias 18C–18H and the transmission lines 11 and 12 can be determined easily.

The first and second ground vias 18A and 18B have the same length. The third to eighth ground vias 18C to 18H all have nearly the same length as the signal via 13. The ground vias 18A–18H extend nearly parallel to the signal via 13. The third to eighth ground vias 18C to 18H pass through the insulator 14 and the first ground layer 15, and are connected between the second and third ground layers 16 and 17. The first to third ground layers 15–17 are connected to each other by the ground vias 18A–18H, and thereby the ground layers 15 to 17 are kept at the same potential with high stability.

As shown in FIG. 1 and FIG. 2B, the via land 19 is sandwiched between the first and second vias 13A and 13B in the second layer L2. The via land 19 is an electrically conductive circular plate. The diameter of the via land 19 is greater than those of the first and second vias 13A and 13B. The end surfaces of the vias 13A and 13B are in contact with the both principal surfaces of the via land 19. The vias 13A and 13B are electrically connected to each other through the via land 19 and serve as the signal via 13.

The ground layers include the via lands which are portions in contact with the ground vias for electrical conduction between the ground layers and the ground vias. As shown in FIG. 2A, semicircular via lands 17B to 17H are formed in the third ground layer 17 to abut the second to eighth ground vias 18B to 18H, respectively. As shown in FIG. 2B, semicircular via lands 15D and 15G are formed in the first ground layer 15 to surround the ground vias 18D and 18G, respectively. As shown in FIG. 2C, semicircular via lands 16A and 16C to 16H are formed in the second ground layer 16 to abut the first ground via 18A and the third to eighth ground vias 18C to 18H, respectively. All these via lands, which are used for the ground vias, have the same diameter. The diameter is greater than those of the ground vias.

As shown in FIG. 2B, an end portion 15C of the first ground layer 15 extends from the first ground via 18A toward the signal via 13 along the first transmission line 11. As shown in FIGS. 2B and 2C, the portion 15C protrudes with respect to the second ground layer 16, and extends nearer to the signal via 13 than an end of the second ground layer 16 which is opposite to the portion 15c. The portion 15C is directly adjacent to a portion of the ground layer 15 which abuts an end face of the ground via 18A. The end of the second ground layer 16 abuts the opposite end face of the ground via 18A. As shown in FIG. 1, the portion 15C protrudes beyond the end of the second ground layer 16. The portion 15C is directly under the transmission line 11. The first ground layer 15 has a larger area overlaid with the transmission line 11 than the second ground layer 16 because of the extended portion 15c. The edge 15D of the portion 15C is located nearly at the middle between the ground via 18A and the signal via 13 in this embodiment.

A portion 15F of the ground layer 15 extends from the second ground via 18B toward the signal via 13 along the second transmission line 12. As FIGS. 2A and 2B show, the portion 15F protrudes with respect to the third ground layer 17, and extends nearer to the signal via 13 than an end of the ground layer 16 which is opposite to the portion 15F. The portion 15F is directly adjacent to a portion of the ground layer 15 which abuts an end face of the ground via 18B. The end of the third ground layer 17 abuts the opposite end face of the ground via 18B. As shown in FIG. 1, the portion 15F protrudes beyond the end of the third ground layer 17. The portion 15F is directly over the transmission line 12. The first ground layer 15 has a larger area covering the transmission line 12 than the third ground layer 17 because of the extended portion 15F. The edge 15H of the portion 15F is located nearly at the middle between the ground via 18B and the signal via 13 in this embodiment.

The advantages of the PCB 1 will now be described. The first ground layer 15 has a larger area extending in parallel to the first transmission line 11 due to the extended portion 15c. Therefore, the characteristic impedance of the transmission line 11 is continuous by a longer length near the signal via 13. As a result, the characteristic impedance of the PCB 1 can be stabilized. Similarly, The first ground layer 15 has a larger area extending in parallel to the second transmission line 12 due to the extended portion 15F. Therefore, the characteristic impedance of the transmission line 12 is continuous by a longer length near the signal via 13. As a result, the characteristic impedance of the PCB 1 can be further stabilized.

The ground vias 18C, 18D, 18F and 18G are placed in parallel to the both sides of the first transmission line 11 with a uniform distance due to the rectangular arrangement of the grand vias. Similarly, the ground vias 18D, 18E, 18G and 18H are placed in parallel to the both sides of the second transmission line 12 with a uniform distance. This reduces the adverse effect of the ground vias on the impedance matching of the transmission line 11 and 12, and therefore the characteristic impedance can be further stabilized.

As shown in FIG. 1, the extended portion 15C of the first ground layer 15 protrudes with respect to the via land 16A of the second ground layer 16 and extends nearer to the signal via 13 than the via land 16A. Also, the extended portion 15F of the first ground layer 15 protrudes with respect to the via land 17B of the third ground layer 17 and extends nearer to the signal via 13 than the via land 17B. Therefore, the ground vias 18A and 18B which abut the via lands 16A and 17B can be sufficiently separated from the signal via 13. Consequently, the ground vias 18A and 18B can advantageously stabilize the characteristic impedance of the signal via 13. Moreover, contact between the second and third ground layers 16 and 17 and the signal via 13 can easily be avoided when manufacturing the PCB 1.

In order to optimize the characteristic impedance of the first transmission line 11 near the signal via 13, the extended portion 15C is preferably as close as possible to the signal via 13. However, if the extended portion 15C is too close to the signal via 13, a mismatch in the characteristic impedance of the signal via 13 becomes large, and the stability of the characteristic impedance of the PCB 1 is hindered.

Figure 3A:
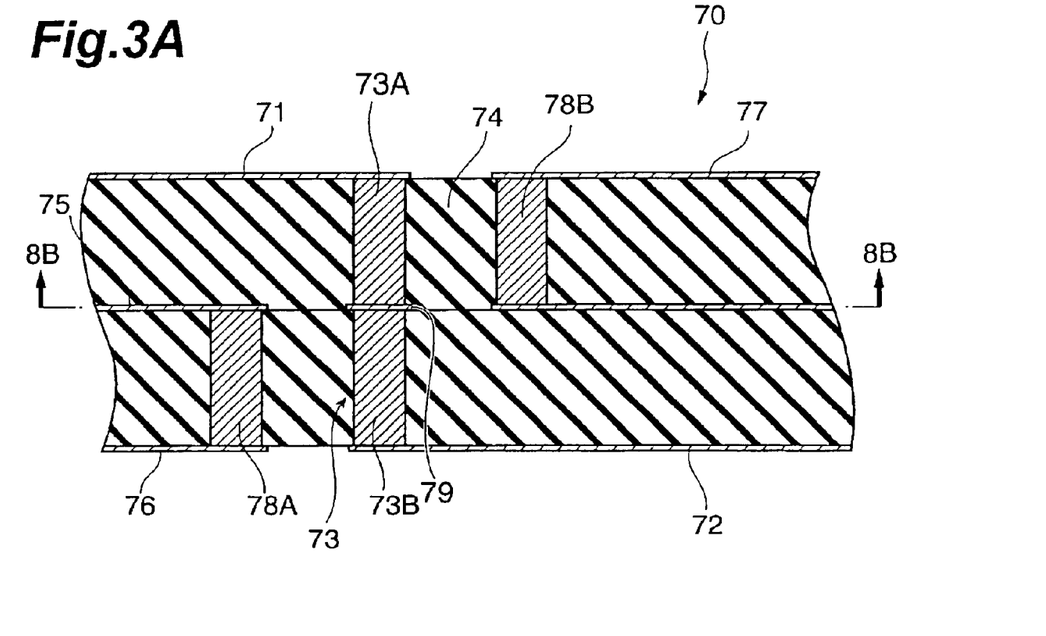
FIG. 3A is a sectional side elevation of the comparative example.
Figure 3B:
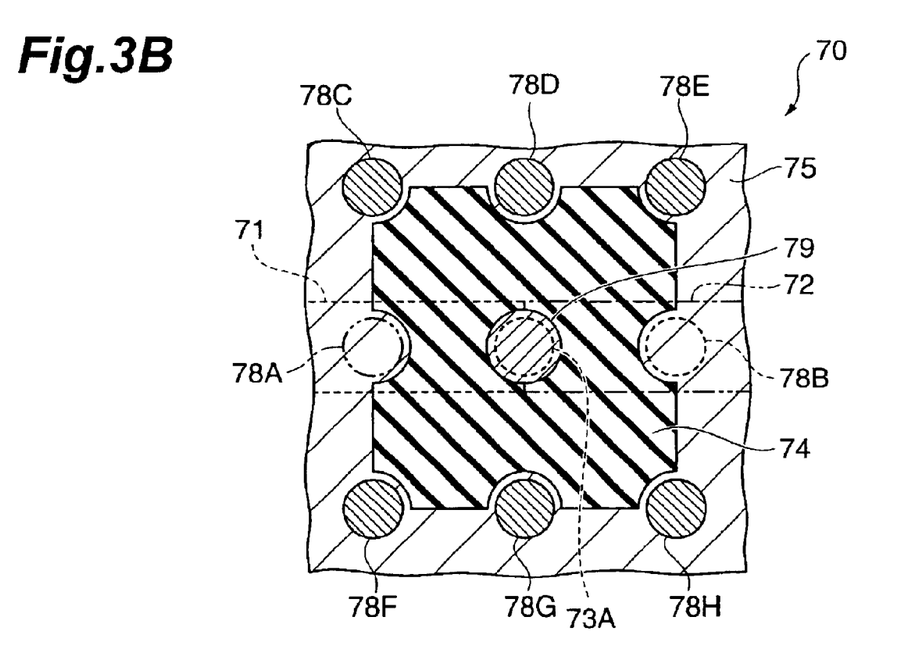
FIG. 3B is a sectional view taken along the line 3B—3B in FIG. 3A.

The inventor of the present invention conducted experiments to calculate the length of the extended portion 15C at which the characteristic impedance can be suitably stabilized. The inventor prepares a comparative example as shown in FIGS. 3A and 3B. FIG. 8A is a sectional side elevation of a multilayer PCB 70 of the comparative example, and FIG. 8B is a sectional view taken along the line 8B—8B in FIG. 8A. The PCB 70 has first and second signal transmission lines 71 and 72, a signal via 73, an insulator 74, first to third ground layers 75–77, ground vias 78A–78H and a via land 70. As shown in these figures, the PCB 70 has a configuration similar to the above PCB 1, except that a ground layer 75 does not have an extended portion.

Figure 4A:
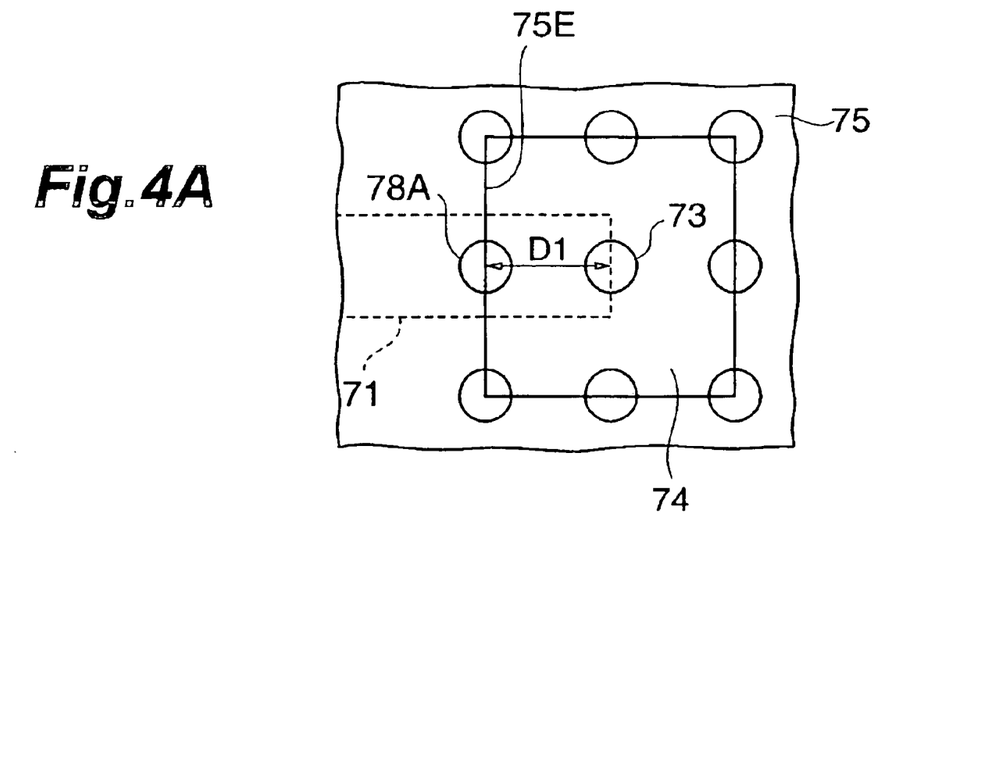
FIG. 4A is a schematic diagram showing arrangement of a ground layer and ground vias in a comparative example of a multilayer PCB.
Figure 4B:
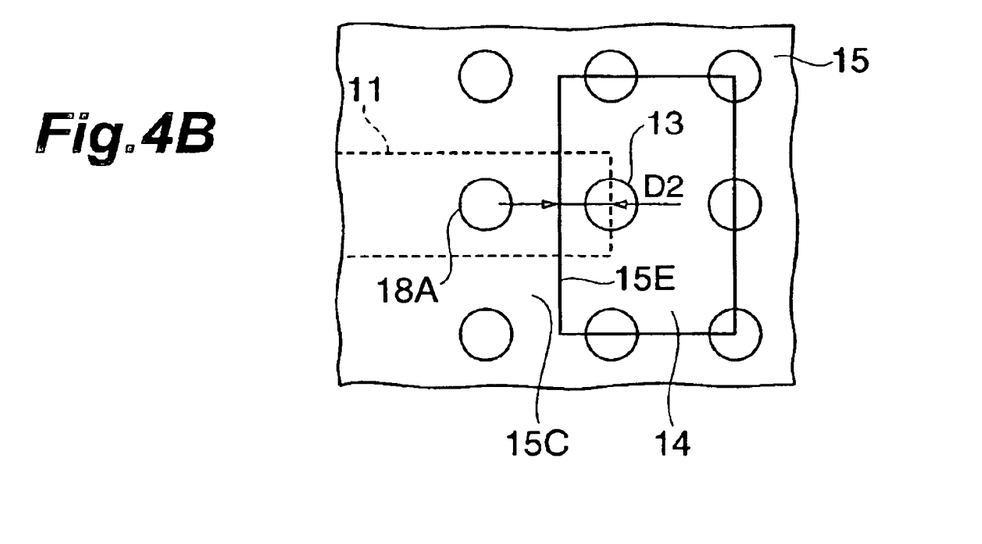
FIG. 4B is a schematic diagram showing arrangement of a ground layer and ground vias in the embodiment.

FIG. 4A is a schematic diagram showing the arrangement of the ground layer 75 and the ground via 78A in the comparative example. FIG. 4B is a schematic diagram showing the arrangement of the ground layer 15 and the ground via 18A in the embodiment. In these diagrams, the signal transmission line opposite to the ground via is shown by a broken line. The via lands formed on the periphery of the ground via and the signal via are omitted in these figures.

In the comparative example, the edge 75E of the ground layer 75 is aligned with the center of the ground via 78, as shown in FIG. 4A. A distance D1 between the centers of the ground via 78 and the signal via 73 is 0.64 mm. The specific inductive capacity of the insulator 74 is 3.74, the diameter of each via is 0.15 mm, and the diameter of each via land is 0.25 mm. In the embodiment, the ground layer 15 extends from the ground via 18A toward the signal via 13, as shown in FIG. 4B. D2 is a distance between the edge 15E of the ground layer 15 and the center of the signal via 13. The specific inductive capacity of the insulator, the diameter of each via, and the diameter of each via land are all the same as in the comparative example. Three PCBs were prepared as examples of the embodiment, wherein the distances D2 are 0.2 mm, 0.3 mm and 0.4 mm.

Figure 5A:
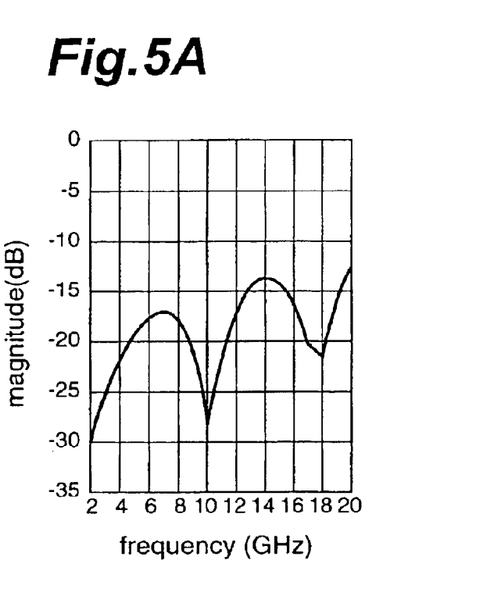
FIG. 5A is a graph showing the relationship between frequency and reflection characteristic in the comparative example.
Figure 5B:
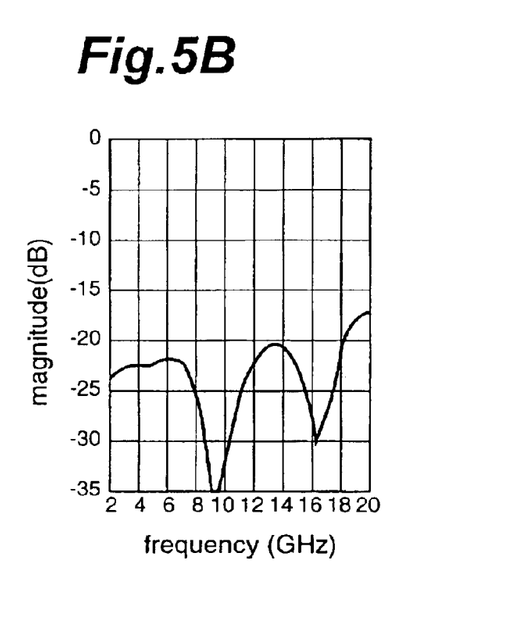
FIGS. 5B to 5D are graphs showing the relationships between frequency and reflection characteristic in examples of the embodiment.
Figure 5C:
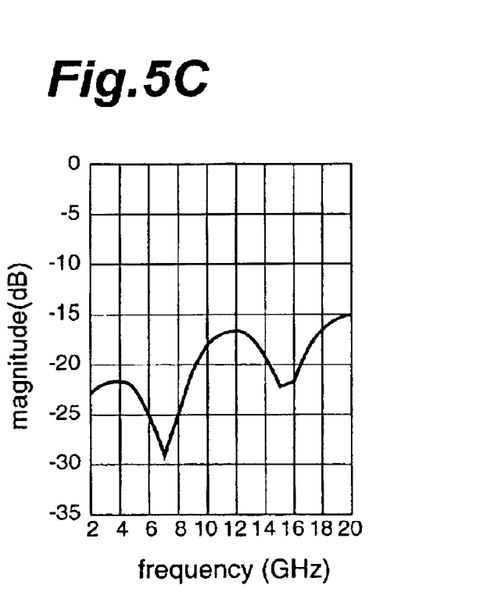
Figure 5D:
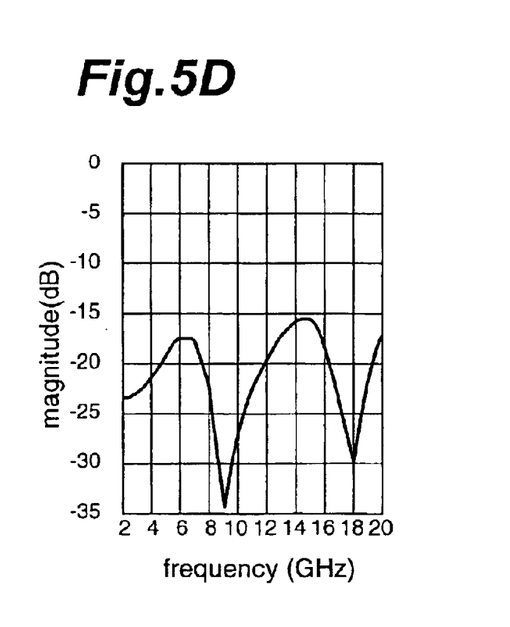

The inventor measured the relationship between the frequency and the characteristic impedance of the comparative example and the examples of the embodiment. The results are shown in FIGS. 5A–5D. FIG. 5A is a graph showing the relationship between the frequency and the reflection characteristic in the comparative example, and FIGS. 5B–5D are graphs showing the relationships between the frequency and the reflection characteristic in the examples of the embodiment. In FIGS. 5B to 5D, D2 is 0.3 mm, 0.2 mm and 0.4 mm, respectively.

In the comparative example, as shown in FIG. 5A, the reflection characteristic is greater than −20 dB in a broad frequency region, and a stable characteristic impedance was not be obtained. By contrast, as shown in FIG. 5B, in the example where D2=0.3 mm, the reflection characteristic in a region with frequencies of 18 GHz or less is always −20 dB or less, and a stable characteristic impedance was obtained. As shown in FIG. 5C, in the example where D2=0.2 mm, the reflection characteristic exceeds −20 dB in a relatively wide frequency region. More favorable reflection characteristic was obtained than that in the comparative example, though the characteristic impedance of this example was not as stable as that of the example where D2=0.3 mm. Furthermore, in the example where D2=0.4 mm, as shown in FIG. 5D, the reflection characteristic exceed −20 dB in a wider frequency region. More favorable reflection characteristic was obtained than that in the comparative example, though the characteristic impedance of this example was not as stable as that of the example where D2=0.3 mm.

From the above-described experiments, the inventor thinks that the distance D1 between the end of the first ground layer 15 and the center of the signal via 13 should preferably be 0.3 to 0.7 times the distance between the center of the ground via 18 and the center of the signal via 13 in order to obtain favorable characteristic impedance.

Examples of a product including the above-described multilayer PCB 1 will now be described.

Figure 6:
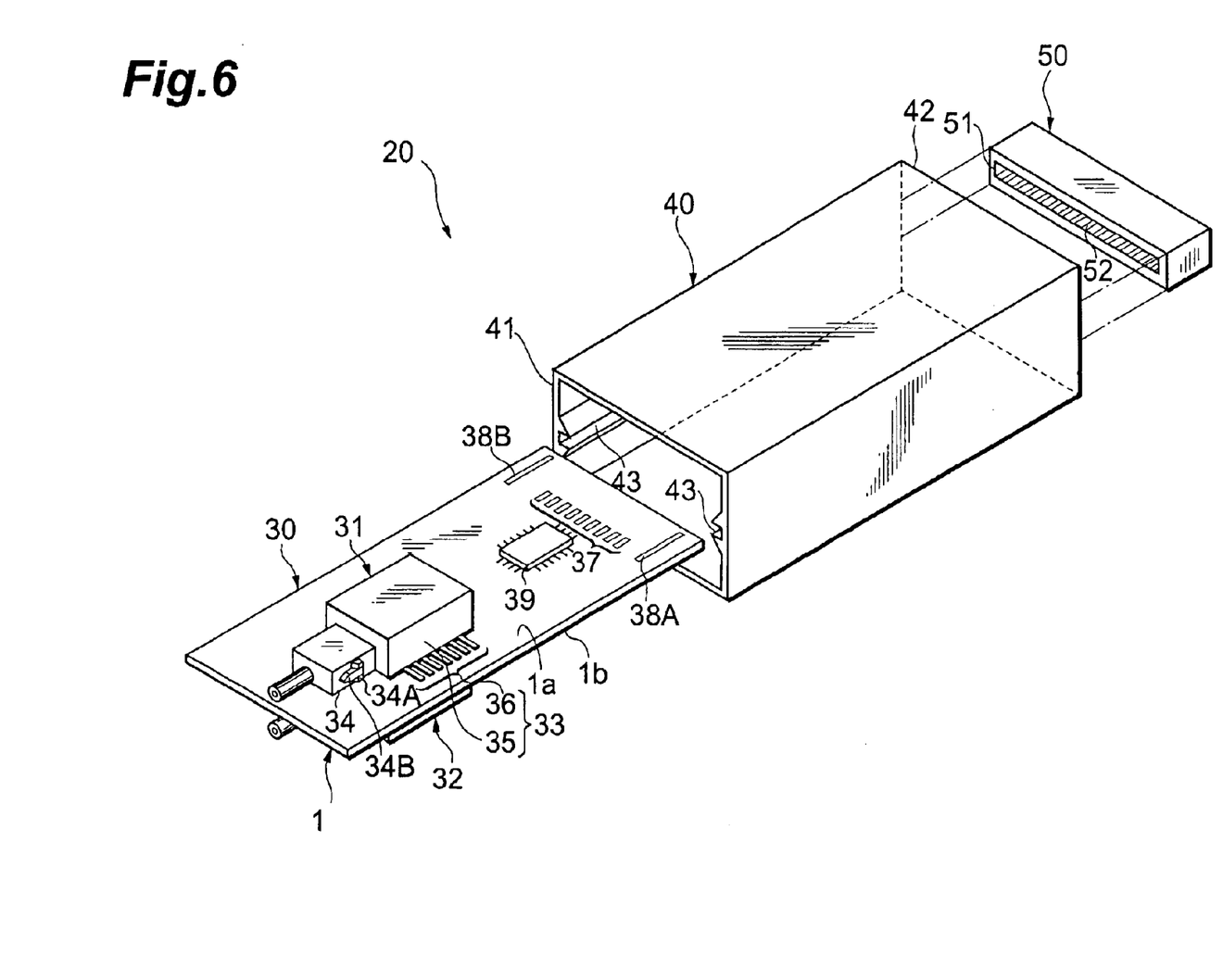
FIG. 6 is an exploded perspective view of a optical link module comprising a light transceiver having the PCB of the embodiment.

FIG. 6 is an exploded perspective view of an optical link module 20 having a light transceiver 30 with the PCB 1. The optical link module 20 also has a case 40 and a host connector 50.

The light transceiver 30 has a light-emitting module 31 enclosing a semiconductor laser or another light-emitting element, a light-receiving module 32 enclosing a photodiode or another light-receiving element, and the PCB 1. The modules 31 and 32 are mounted on the PCB 1.

The light-emitting module 31 has a sealed portion 33 in which the light-emitting element is sealed, and a coupling portion 34 to be engaged with an optical connector receptacle (not shown).

The sealed portion 33 has a base member 35, a plurality of lead pins 36, and a radiator plate (not shown). The lead pins 36 used for signal lines are designed so that impedance matching is achieved. The lead pins 36 and the radiator plate are fixed to the bottom surface of the base member 35. The lead pins 36 and the radiator plate are made of a metal such as Kovar. Some of the lead pins 36 used for a grounding line are electrically connected to the radiator plate.

The coupling portion 34 has a ferrule including an optical fiber, a sleeve for holding the ferrule, or the like. The both side surfaces of the coupling portion 34 are provided with projections 34A for coupling with interlocking teeth of the connector receptacle, and guide ribs 34B for defining an angle between the coupling portion 34 and the connector receptacle when the receptacle is attached to the coupling portion 34.

The light-receiving module 32 has a sealed portion in which the light-receiving element is sealed, and a coupling portion to be engaged with an optical connector receptacle. The sealed portion has a structure in which the light-receiving element is sealed in place of the light-emitting element in the sealed portion 33. The coupling portion has the structure identical to the coupling portion 34 of the light-emitting module 31.

A plurality of wiring patterns 37 for the signal lines are formed on top and bottom surfaces 1a and 1b of the rear end of the PCB 1. A wiring pattern 38A for a power supply line and a wiring pattern 38B for a grounding line are formed so that the wiring patterns 37 are disposed therebetween. The wiring patterns 38A and 38B are longer than the wiring patterns 37 and extend to the vicinity of the edge of the PCB 1. An IC 39, which is an electronic device for waveform shaping, is mounted on the both surfaces 1a and 1b. The signal transmission lines on the board 1 electrically connect the lead pins 36 of the light-emitting module 31 and light-receiving module 32 to the wiring patterns 37, 38A and 38B and IC 39.

The case 40 is a cylindrically shaped metal body. The case 40 has rectangular openings 41 and 42 at the both ends thereof. The inner surfaces of the side walls of the case 40 opposite to each other are provided with rails 43 extending along the length of the side walls.

The host connector 50 is a rectangular solid made of resin. An opening 51 for interlocking with the end of board 1 is provided on the front of the host connector 50. A plurality of metal spring terminals 52 is provided on the surface of the opening 51.

The host connector 50 is fixed near the rear opening 42 of the case 40. The light transceiver 30 is inserted into the case 40 from the front opening 41 by sliding the board 1 along the pair of rails 43. The rear end of the board 1 interlocks with the opening 51 of the host connector 50. Thus, the wiring patterns 37, 38A and 38B of the board 1 are electrically connected to the spring terminals 52.

Because the light transceiver 30 has the above-described PCB 1, the characteristic impedance can be stabilized, and therefore the light transceiver 30 can display stable capability of data transmission. Particularly, since favorable reflective characteristic can be obtained in a frequency region around 10 GHz, the characteristic impedance can be suitably stabilized in the light transceiver 30 even when signals are sent and received at a speed of 10 Gbps or greater.

Figure 7:
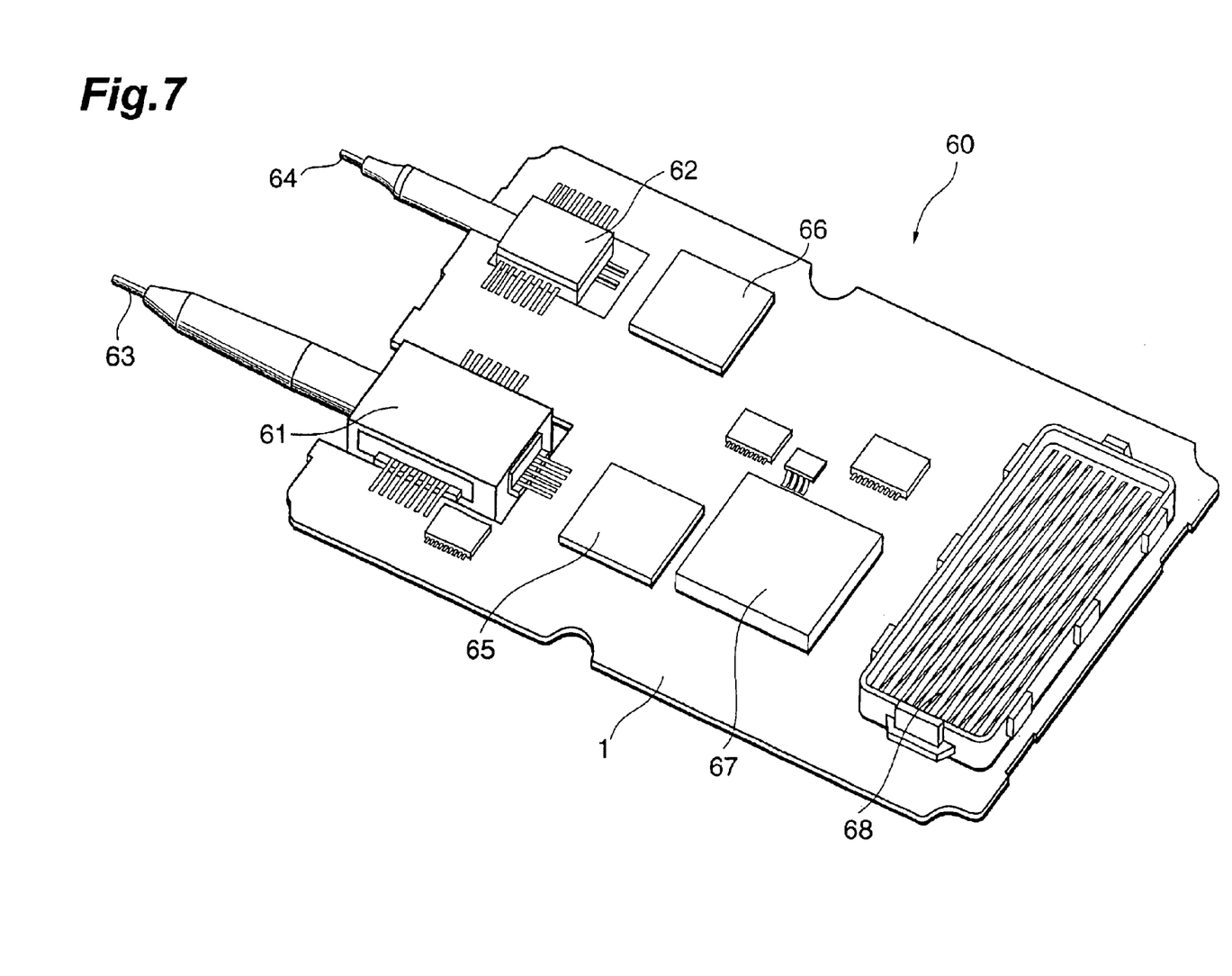
FIG. 7 is a cross-sectional view of a transponder having the PCB of the embodiment.

FIG. 7 is a perspective view of a transponder 60 having the PCB 1. In the transponder 60, a light-emitting module 61 and a light-receiving module 62 are mounted on the PCB 1. Optical fibers 63 and 64 are connected to the front ends of the light-emitting module 61 and the light-receiving module 62, respectively. On the PCB 1, a multiplexing IC 65 is mounted at the back of the light-emitting module 61, and a demultiplexing IC 66 is mounted at the back of the light-receiving module 62.

The light-emitting module 61 and the light-receiving module 62 are electrically connected to the multiplexing IC 65 and the demultiplexing IC 66 by the signal transmission lines of the PCB 1, respectively. The light-emitting module 61 includes a semiconductor laser diode, driver, or the like, and converts electrical signals from the multiplexing IC 65 into optical signals to output them through the optical fiber 63. The light-receiving module 62 includes a photodiode, preamplifier, or the like, and converts optical signals from the optical fiber 64 into electrical signals and outputs them to the demultiplexing IC 66. Electronic components such as a processing IC 67 and the like are mounted at the back of the ICs 65 and 66. A connector 68 is mounted on the rear end of the board 1 at the back of these electronic components.

Because the transponder 60 has the above-described PCB 1, the characteristic impedance can be stabilized, and thereby the transponder 60 can display stable capability for data transmission. Particularly, since favorable reflective characteristics can be obtained in a frequency region around 10 GHz, the characteristic impedance can be suitably stabilized in the transponder 60 even when signals are sent and received at a speed of 10 Gbps or greater.

Figure 8A:
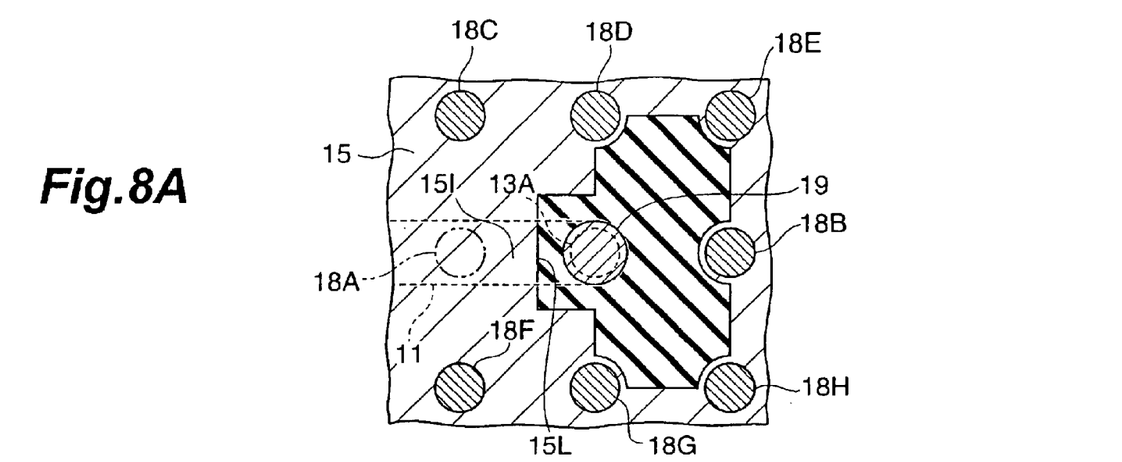
FIGS. 8A–8C are schematic diagrams showing examples of an extending portion of a first ground layer.
Figure 8B:
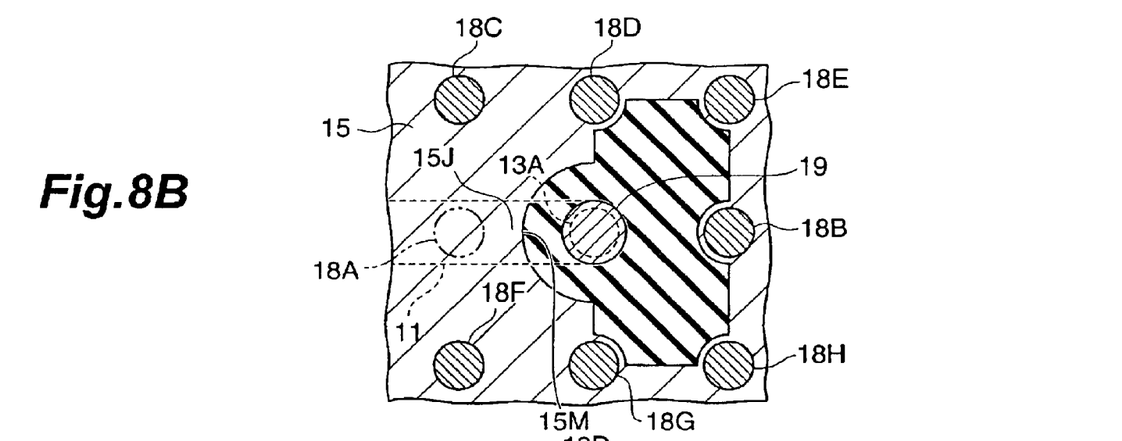
Figure 8C:
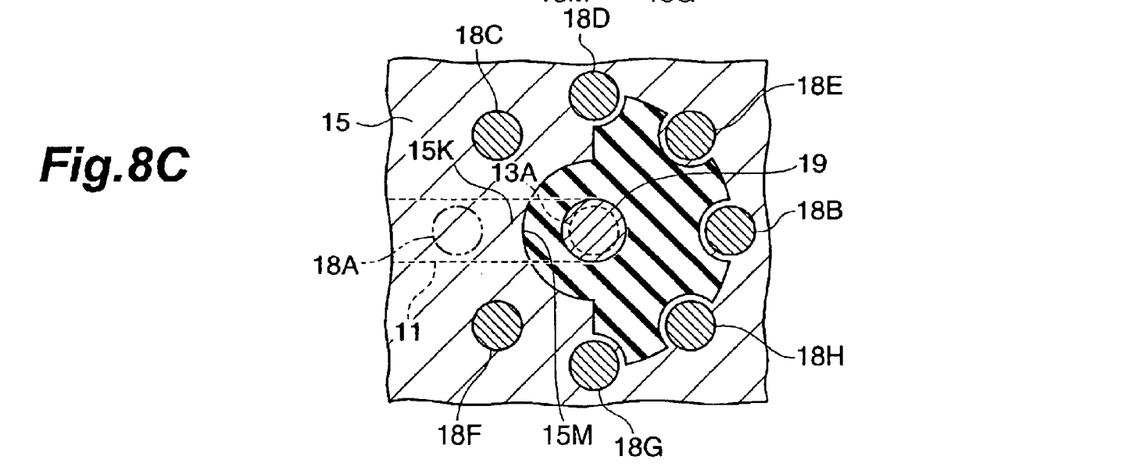

The preferred embodiment of the invention is described above, however; the present invention is not limited to the embodiment. The extended portion 15C in the embodiment protrudes by the uniform distance toward the signal via 13 from the ground vias 18A, 18C and 18F. However, the multilayer PCB of the present invention may have an extended portion 15I as shown in FIG. 8A. The edge of the extended portion 15I has concavity 15L along the transmission line 11. The concavity 15L is directly under the transmission line 11. A part of the extended portion 15I overlaid with the transmission line 11 protrudes more shortly than the parts on both sides of the overlaid area. As shown in FIG. 8B, the PCB of the present invention may have an extended portion 15J having a semicircular edge 15M around the signal via 13. The edge 15M is overlaid with the transmission line 11. Furthermore, as shown in FIG. 8C, the ground vias 18A to 18H may be disposed at equal intervals on a circular line around the signal via 13 in a plane perpendicular to the signal via 13. In this case, the PCB may have an extended portion 15K having the semicircular edge 15M around the signal via 13.

The transmission lines 11 and 12 in the above-described embodiment are so-called microstrip lines, which are formed on the surfaces of the board 1. However, the transmission lines may be so-called strip lines formed inside the board. The above-described embodiment have the first to third layers, but the multilayer PCB of the present invention may have two layers, four layers or more. The above-described signal via 13 includes two vias 13A and 13B connected by way of the via land 19. However, the signal via may be an one-piece conductor. In this case, the via land is not necessary. The above-described vias all have a structure in which conductive material filled into the via holes. However, hollow vias in which the side walls of the via holes is coated with conductive material may be used. The hollow signal vias may have two hollow vias coaxially connected to each other, and a ring-shaped via land may be disposed between the hollow vias.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A multilayer printed circuit board (PCB), comprising:
   a first signal transmission line;
   a second signal transmission line opposite to the first transmission line;
   a first ground layer opposite to the first transmission line;
   a second ground layer opposite to the first ground layer;
   a first insulator disposed between the first and second transmission lines;
   a second insulator disposed between the first and second ground layers;
   a signal via passing through the first insulator and connected between the first and second transmission lines, the signal via being separated from the first and second ground layers; and
   a ground via passing through the second insulator and connected between the first and second ground layers, the ground via being separated from the signal via,
   wherein the first ground layer has an end protruding with respect to the second layer, the end extending nearer to the signal via than an end of the second ground layer opposite to the end.

2. The multilayer PCB according to claim 1,
   wherein the end of the first ground layer includes a portion which abuts an end face of the ground via and a portion directly adjacent to the abutting portion,
   wherein the end of the second ground layer abuts an opposite end face of the ground via, and
   wherein the adjacent portion of the first ground layer extends from the ground via toward the signal via along the first transmission line beyond the end of the second ground layer.

3. The multilayer PCB according to claim 1, wherein the first ground layer has a larger area overlaid with the first transmission line than the second ground layer.

4. The multilayer PCB according to claim 1, further comprising another plurality of ground vias,
   wherein the ground via and the other plurality of ground vias are disposed at equal intervals on a line forming a square around the signal via.

5. The multilayer PCB according to claim 1, further comprising another plurality of ground vias,
   wherein the ground via and the other plurality of ground vias are disposed at equal intervals on a line forming a circle around the signal via.

6. A light transceiver, comprising:
   the multilayer PCB according to claim 1; and
   a light-emitting module, a light-receiving module, and an electronic element mounted on the multilayer PCB,
   wherein the electronic element is electrically connected to the light-emitting module or the light-receiving module via the first and second transmission lines of the PCB.

7. A transponder, comprising:
   the multilayer PCB according to claim 1;
   a light-emitting module, a light-receiving module, a multiplexing IC, and a demultiplexing IC fixed to the multilayer PCB,
   wherein either the light-emitting module and the multiplexing IC or the light-receiving module and the demultiplexing IC are electrically connected by the first and second transmission lines of the PCB.

* * * * *